United States Patent [19]
Keeth

[11] Patent Number: 6,018,236
[45] Date of Patent: *Jan. 25, 2000

[54] DIFFERENTIAL VOLTAGE REGULATOR

[75] Inventor: Brent Keeth, Boise, Id.

[73] Assignee: Micron Technology, Inc., Boise, Id.

[*] Notice: This patent is subject to a terminal disclaimer.

[21] Appl. No.: 09/193,480

[22] Filed: Nov. 17, 1998

Related U.S. Application Data

[63] Continuation of application No. 08/948,386, Oct. 10, 1997, Pat. No. 5,838,150, and application No. 08/668,347, Jun. 26, 1996, abandoned.

[51] Int. Cl.[7] .............................. G05F 3/04; G05B 24/02
[52] U.S. Cl. .......................... 323/313; 323/349; 323/312
[58] Field of Search .................................. 323/312, 313, 323/314, 315, 349

[56] References Cited

U.S. PATENT DOCUMENTS

| | | | |
|---|---|---|---|
| 4,142,114 | 2/1979 | Green | 307/304 |
| 4,419,594 | 12/1983 | Gemmell et al. | 307/297 |
| 4,581,546 | 4/1986 | Allan | 307/297 |
| 4,958,133 | 9/1990 | Bazes | 330/253 |
| 5,077,518 | 12/1991 | Han | 323/275 |
| 5,335,202 | 8/1994 | Manning et al. | 365/222 |
| 5,412,309 | 5/1995 | Ueunten | 323/316 |
| 5,455,794 | 10/1995 | Javanifard et al. | 365/185 |

OTHER PUBLICATIONS

"Assignee's existing DRAM designs", See attached Exhibits AA, BB, 1, No date ava.

"Attached Exhibit CC", schematic of differential regulator for VCCP, No date ava.

Baker, et al., "CMOS Circuit Design, Layout and Simulation with LASI The LAout System for Individuals", http://www.engboi.uidaho.edu/lan–group/jbaker/book.htm, No date ava.

Bazes, M., "Two Novel Fully Complementary Self–Biased CMOS Differential Amplifiers", *IEEE Journal of Solid–State Circuits*, vol. 26, No. 2, 165–168, (Feb., 1991).

*Primary Examiner*—Peter S. Wong
*Assistant Examiner*—Rajnikant B. Patel
*Attorney, Agent, or Firm*—Schwegman, Lundberg Woessner & Kluth P.A.

[57] ABSTRACT

A voltage regulator (10) that regulates an input voltage. The voltage regulator (10) includes a current source (20) that generates a reference current. The voltage regulator also includes a voltage translation circuit (30), coupled to and responsive to the current source (20), that increases the input voltage to generate a differential voltage signal. The voltage regulator (10) further includes a differential comparator circuit (40) coupled to the voltage translation circuit (30) that generates a control signal based on the differential voltage from the voltage translation circuit (30) to indicate when the input voltage should be adjusted.

23 Claims, 3 Drawing Sheets

DIFFERENTIAL VOLTAGE REGULATOR

CROSS REFERENCE TO RELATED APPLICATION

This application is a continuation of U.S. Ser. No. 08/948,386 filed Oct. 10, 1997, now U.S. Pat. No. 5,838,150, and issued Nov. 17, 1998, which was a File Wrapper Continuation of U.S. Ser. No. 08/668,347, filed Jun. 26, 1996, and now abandoned.

This application is related to commonly assigned, co-pending U.S. application Ser. No. 08/521,563, entitled Voltage Regulator Circuit.

TECHNICAL FIELD OF THE INVENTION

The present invention relates generally to integrated circuits and in particular the present invention relates to voltage regulators.

BACKGROUND OF THE INVENTION

Integrated circuits are used in a wide variety of applications. Systems ranging from personal computers to automobiles rely on integrated circuits to function properly. In these systems, the integrated circuits process data based on electronic signals input to the integrated circuit. The integrated circuits produce output signals for the system in response to the input signals. Further, the integrated circuits often use internal electronic signals in producing acceptable output signals. Depending on the type of integrated circuit, it typically includes circuits that regulate the internal electronic signals to stay within an acceptable range so that the integrated circuit operates properly.

An example of a data storage or memory device having such internal voltage regulation circuits is a dynamic random access memory (DRAM). Conventional DRAMs include memory arrays with intersecting row and column lines coupled to individual storage cells. Conventional DRAMs include an externally generated power supply (Vcc) and a common ground. The devices of the DRAM use the common ground and power supply voltages in order to function properly. Typical DRAMs also include a voltage (Vccp) that is above the power supply that drives the word lines of the DRAM. Also, the semiconductor substrate of the DRAM is usually biased below common ground with a back bias voltage (Vbb). A biased substrate gives better control over threshold voltages, reduces transistor leakage, and guards against latch-up.

Many DRAM circuits include voltage regulators that monitor voltages such as the pumped supply voltage or back bias voltage. Conventional voltage regulators attempt to maintain a substantially constant difference between the monitored voltage and a reference voltage, for example between Vccp and Vcc or between Vbb and common ground. The voltage regulators typically activate stabilizing circuitry when fluctuations occur in the monitored voltage. Conventional voltage regulators include an input stage designed with a trip point carefully adjusted to toggle at a desired voltage level. When the monitored voltage crosses the trip point of the input stage, a signal is generated and amplified to activate stabilizing circuitry to correct the variation in the monitored voltage. While this type of voltage regulator is useful, it is typically difficult to implement. The actual value of the monitored voltage is a function of diode voltage/current, input stage trip point, and cumulative amplifier gain. Possible variations in these interactive factors complicate the realization of this type of voltage regulator. Additionally, high crossing currents are generated when this type of voltage regulator is operated near the input stage trip point.

Designers have tried to overcome these difficulties by implementing voltage regulators that include a voltage translation stage and a differential comparator stage. Although these differential voltage regulators are more readily implemented, their operation is unpredictable due to fluctuations in externally generated power signals. The voltage translation stage of conventional differential voltage regulators are sensitive to fluctuations in Vcc, causing non-linearities and incorrect operation. Further, these differential voltage regulators may not operate correctly due to non-linearities of the differential amplifier in the differential comparator stage.

For the reasons stated above, and for other reasons stated below which will become apparent to those skilled in the art upon reading and understanding the present specification, there is a need in the art for a voltage regulator that more accurately and consistently regulates an input voltage.

SUMMARY OF THE INVENTION

The above mentioned problems with voltage regulators and other problems are addressed by the present invention and which will be understood by reading and studying the following specification. A voltage regulator is described which uses a current source to establish a differential input voltage for a differential comparator stage to determine whether the regulated voltage is within an acceptable range.

In particular, one embodiment of the present invention provides a voltage regulator that regulates an input voltage. The voltage regulator includes a current source that generates a reference current. The voltage regulator also includes a voltage translation circuit, coupled to and responsive to the current source, that increases the input voltage to generate a differential voltage signal. The voltage regulator further includes a differential comparator circuit coupled to the voltage translation circuit that generates a control signal based on the differential voltage from the voltage translation circuit to indicate when the input voltage should be adjusted.

DETAILED DESCRIPTION OF THE INVENTION

In the following detailed description of the illustrative embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
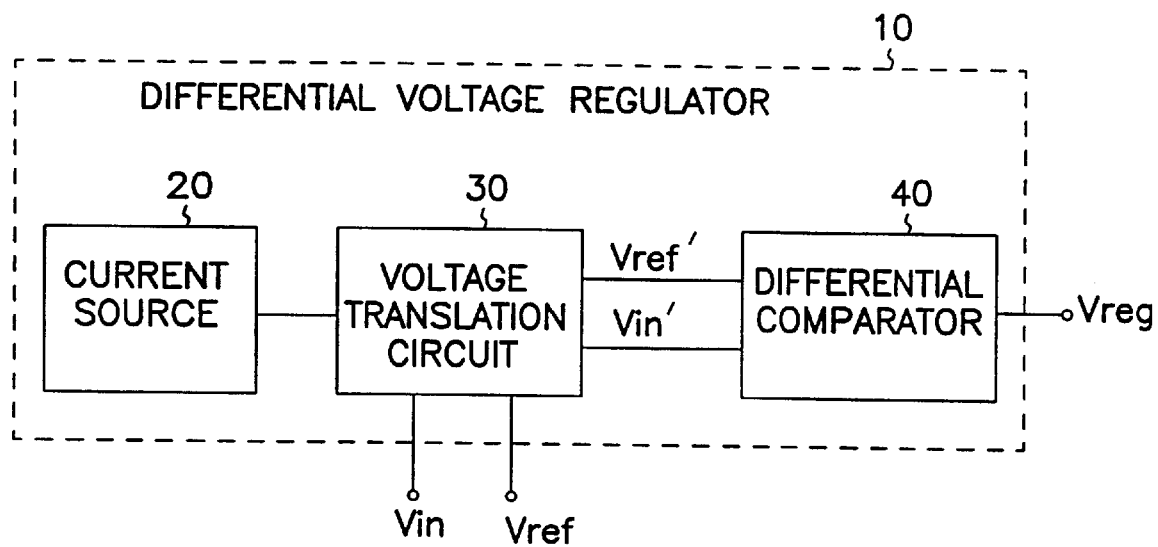
FIG. 1 is a block diagram of an embodiment of a voltage regulator constructed according to the teachings of the present invention.

FIG. 1 is a block diagram of an embodiment of a voltage regulator constructed according to the teachings of the present invention. In this embodiment, a differential voltage regulator 10 includes a current source 20, a voltage translation circuit 30, and a differential comparator 40. Current source 20 generates a current and is coupled to establish a bias current in voltage translation circuit 30. Current source 20 may also be coupled to establish a bias current for differential comparator 40. Current source 20 is designed to produce current that is relatively immune to variations in externally generated power signals. Voltage translation circuit 30 translates the voltage level of an input voltage signal, Vin, and a reference voltage signal, Vref. Voltage translation circuit 30 provides a differential voltage signal, Vin'-Vref', to differential comparator 40 within the common mode range of differential comparator 40. Advantageously, the amount of translation in Vin and Vref is based on the current of current source 20 such that the differential voltage signal, Vin'-Vref', produces a measurable voltage difference when Vin fluctuates. Differential comparator 40 generates a control signal, Vreg, based on this voltage difference that stabilizes Vin.

In operation, voltage regulator 10 generates a control signal to regulate the input voltage, Vin. Voltage translation circuit 30 receives Vin and the reference voltage, Vref. Voltage translation circuit 30 uses a current generated by current source 20 to selectively translate Vin and Vref to produce the differential voltage signal, Vin'-Vref'. Differential comparator 40 provides substantial gain to Vin'-Vref' in order to detect fluctuations from the desired difference between the two signals. When the difference between Vin' and Vref' exceeds a threshold value, differential comparator 40 generates a control signal to stabilize Vin. Thus, voltage regulator 10 stabilizes Vin by maintaining a substantially constant difference between Vin and Vref.

Figure 2:
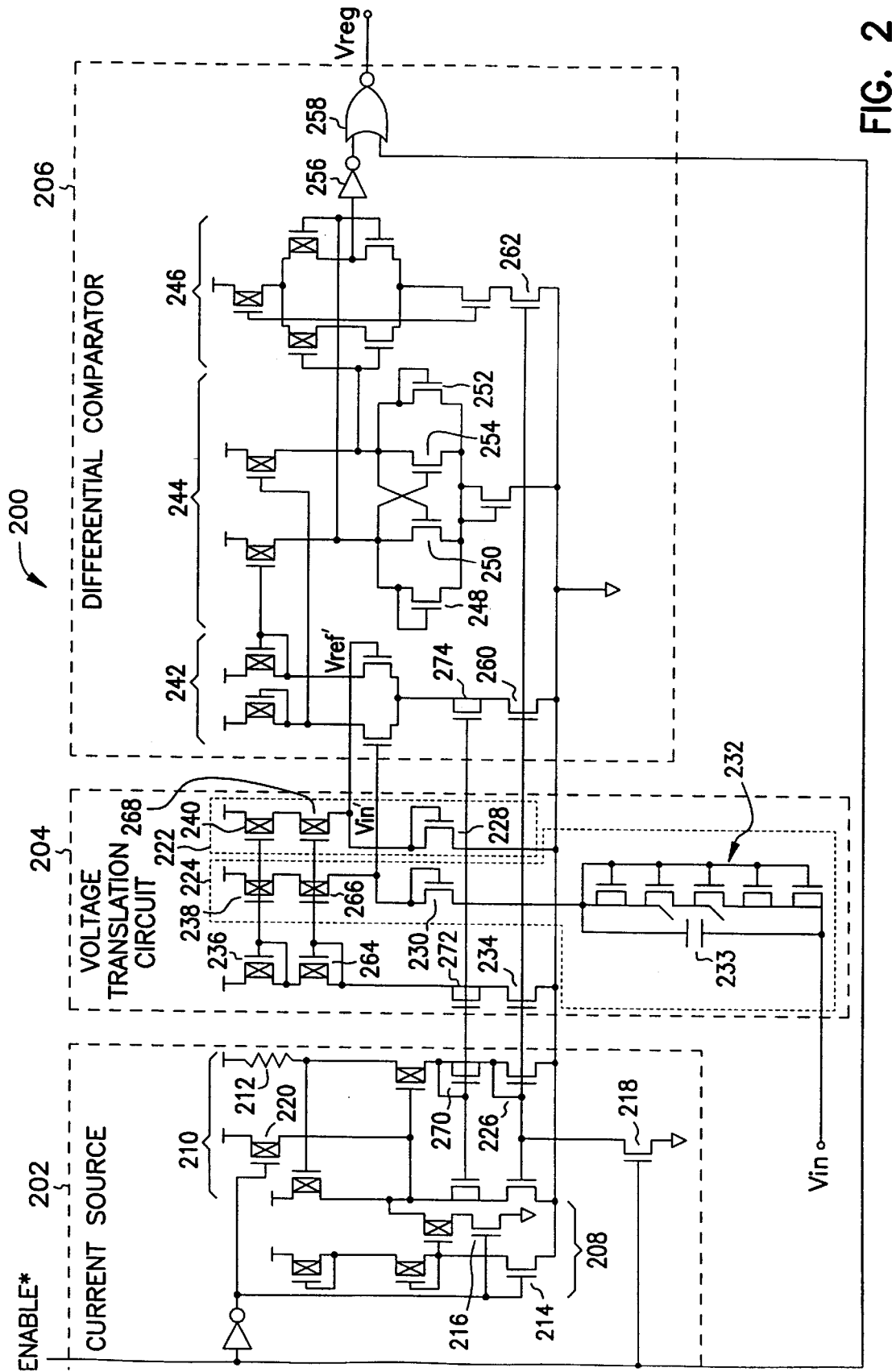
FIG. 2 is a schematic diagram of another embodiment of a voltage regulator constructed according to the teachings of the present invention.

FIG. 2 is a schematic diagram of another embodiment of a voltage regulator constructed according to the teachings of the present invention. In this embodiment, a differential voltage regulator 200 includes a current source 202, a voltage translation circuit 204, and a differential comparator 206.

Current source 202 is a metastable current source with two operating states. Current source 202 produces a stable, non-zero current in a first operating state and no current in a second operating state. Current source 202 includes a conventional bootstrap circuit 208 and a conventional current generator 210. A voltage drop across resistor 212 establishes the current of current generator 210. Transistor 226 is coupled as a current mirror with transistor 234 in voltage translator circuit 204 and transistors 260 and 262 in differential comparator 206. Resistor 212 may be variable to allow changes in the bias current generated by current source 202. Bootstrap circuit 208 causes current source 202 to enter the first operating state to generate a stable, non-zero current. A control signal, labeled ENABLE*, enables the output of current source 202 by controlling the operating mode of transistors 214, 216, 218, and 220. When the ENABLE* signal is low, transistors 214 and 216 are on, transistors 218 and 220 are off, and current source 202 is enabled.

Voltage translation circuit 204 includes first and second level translators 222 and 224. Level translators 222 and 224 each include at least one diode-coupled transistor that translate an input voltage by a known amount. In first level translator 222, transistor 228 is coupled to translate ground potential at the source of transistor 228 to a voltage above ground by approximately one diode drop at the drain of transistor 228. Similarly, transistors 230 and 232 are coupled to translate Vin by a selectable voltage to provide a voltage at the drain of transistor 230 that is a known amount above Vin. The amount of voltage drop across transistors 232 can be varied by adjusting the size of the devices and by adjusting the number of devices used to implement transistors 232.

Level translators 222 and 224 are coupled to current source 202 to establish appropriate bias currents. Specifically, the bias currents in level translators 222 and 224 are controlled by transistors 234, 236, 238, and 240. Transistors 234 and 236 mirror the current in transistor 226. Further, transistors 238 and 240 mirror the current in transistor 236. The bias current in level translators 222 and 224 thus allow Vin and Vref (shown as common ground here) to be translated by a predictable amount. In fact, transistors 228 and 230 can be matched such that they produce substantially identical voltage drops. Thus, transistors 232 can be selected to assure that Vin is regulated at a desired level below ground. Capacitor 233 is coupled in parallel with transistors 232 in order to speed up the response time of differential voltage regulator 200. Further, level translators 222 and 224 generate voltages at the drains of transistors 228 and 230 that are within the common mode range of differential comparator 206.

Transistors 264, 266, 268, 270, 272, and 274 are optional elements that are coupled in a cascode configuration with the current mirrors of differential voltage regulator 200. These transistors can increase the performance of differential voltage regulator 200. However, inclusion of these transistors increases the voltage requirements of differential voltage regulator 200.

Differential comparator 206 includes three differential stages. Differential amplifier 242 is a conventional preamplification stage to improve the sensitivity of differential comparator 206. Differential amplifier 242 amplifies the differential signal Vin'-Vref', thus amplifying the difference between Vin' and Vref'. Differential amplifier 244 is a decision circuit configured as a metastable comparator. Differential amplifier 244 determines which branch of the differential signal, Vin'-Vref', is larger. Differential amplifier 244 can be designed with hysteresis to reject noise on the differential signal, Vin'-Vref'. The amount of hysteresis is controlled by the size ratio of transistor pairs 248/250 and 252/254. Differential amplifier 246 is a self-biasing differential amplifier such as the circuit shown in U.S. Pat. No. 4,958,133. Differential amplifier 246 converts the output of differential amplifier 244 into a single-ended voltage signal. The output of differential amplifier 246 is coupled to an inverter 256 to provide additional gain to differential comparator 206. A control signal, labeled ENABLE*, enables the output of differential comparator 206 by controlling the output of NOR gate 258. When the ENABLE* signal is high, Vreg is forced low. Otherwise, Vreg is controlled by differential comparator 206.

Figure 3:
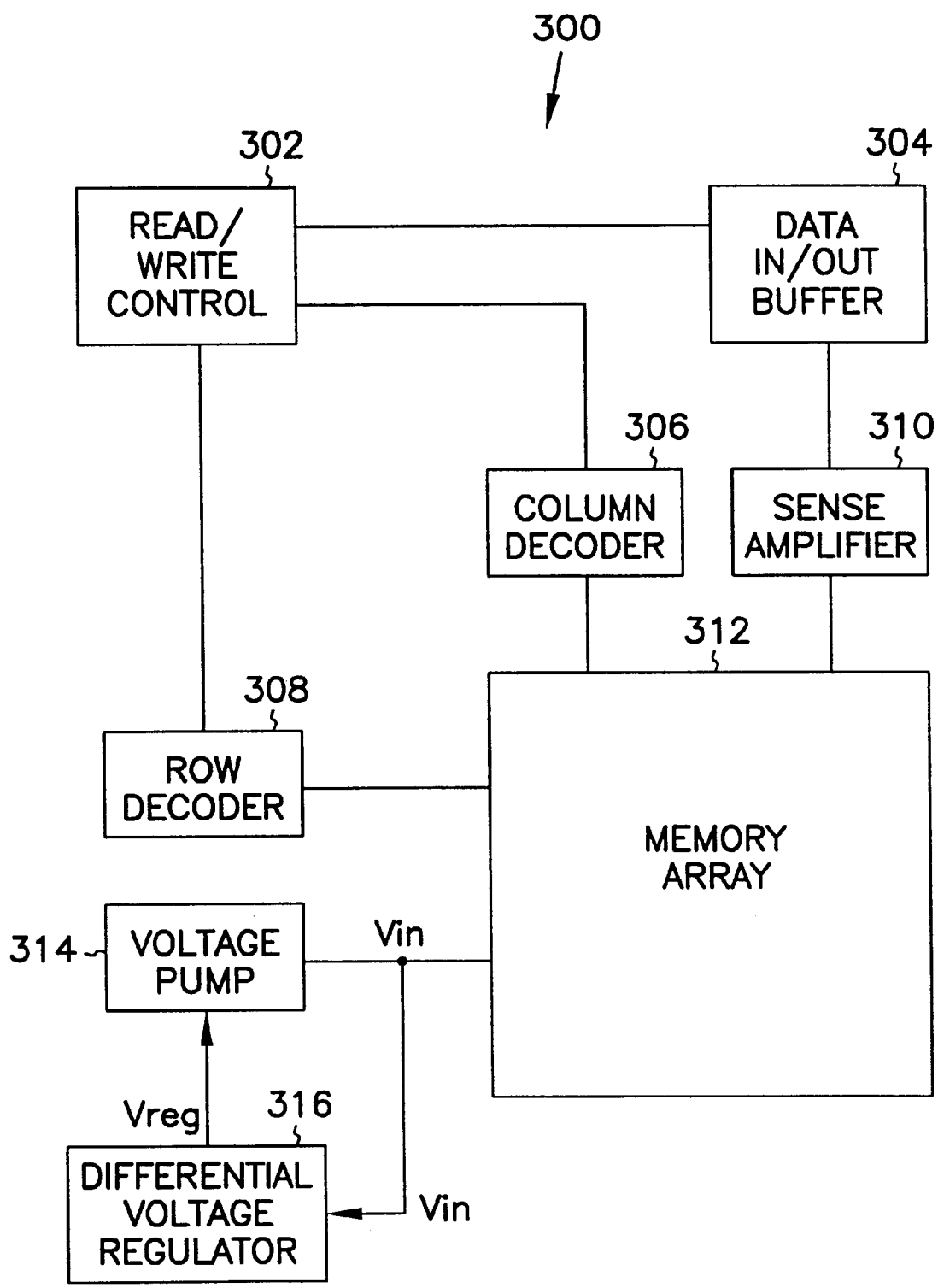
FIG. 3 is a block diagram of an embodiment of the present invention implemented in a memory device.

FIG. 3 is a block diagram of an embodiment of the present invention implemented in a memory device. In this embodiment, a memory device 300 includes a read/write control 302 coupled to a data in/out buffer 304, a column decoder 306, and a row decoder 308. Data in/out buffer 304 is also coupled to a sense amplifier 310. A memory array 312 is coupled to row decoder 308, column decoder 306, sense amplifier 310, and a voltage pump 314. Memory array 312 includes a plurality of storage cells arranged in rows and columns to store data. Each of the above circuits is conventional in implementation and operation.

Memory device 300 includes a differential voltage regulator 316 that is coupled to monitor a voltage, Vin, from memory array 312. The voltage, Vin, may comprise a back bias voltage (Vbb), a pumped supply voltage (Vccp), or other appropriate voltage. Differential voltage regulator 316 is further coupled to a voltage pump 314 to correct variations in the monitored voltage with a control signal, Vreg. Differential voltage regulator 316 uses a current source to establish a differential input voltage for a differential comparator stage to determine whether the regulated voltage is within an acceptable range. For example, differential voltage regulator 316 may be constructed as described above with respect to FIGS. 1 and 2 so as to provide a well regulated voltage, Vin.

In operation, read/write control 302 parses read/write requests into separate memory address and data blocks. Read/write control 302 issues the row address portion of a memory address to row decoder 308 and the column address portion to column decoder 306. Read/write control 302 issues the data portion of a write request to data in/out buffer 304. Row decoder 308 and column decoder 306 collectively select the storage cell of interest. Sense amplifier 310, which is controlled by the read/write control 302, is used to convert the state of the selected storage cell to an appropriate voltage level for the data in/out buffer 304. Read/write control 302 controls the timing and direction of data flow for the memory device 300.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, other types of current sources and differential amplifiers may be used without departing from the spirit and scope of the invention.

What is claimed is:

1. A process for regulating an input voltage, the process comprising:
   generating a bias current with a current source;
   establishing a first voltage relative to the input voltage using the bias current;
   establishing a second voltage relative to a reference voltage using the bias current;
   amplifying a difference between the first voltage and the second voltage; and
   providing a control signal based on the amplified difference to control the level of the input voltage.

2. The process of claim 1, wherein generating the bias current comprises generating a current with a metastable current source.

3. The process of claim 1, wherein establishing the first voltage comprises establishing the first voltage using at least one diode that is coupled to receive the input voltage.

4. The process of claim 1, wherein establishing the second voltage comprises establishing the second voltage using at least one diode that is coupled to receive the reference voltage.

5. The process of claim 1, wherein amplifying the difference comprises amplifying the difference with a multi-stage comparator that includes a hysteresis stage.

6. The process of claim 1, wherein providing a control signal comprises providing a single-ended control signal.

7. A voltage regulator that regulates an input voltage, the voltage regulator comprising:
   a current source that generates a bias current;
   a first level translator, coupled to and responsive to the bias current, that establishes a first voltage, relative to the input voltage;
   a second level translator, coupled to and responsive to the bias current, that establishes a second voltage, relative to a reference voltage; and
   a differential comparator circuit, coupled to receive the first and second voltages from the first and second level translators, that generates a control signal to control the level of the input voltage.

8. The voltage regulator of claim 7, wherein the current source is coupled to an input voltage signal which directly enables or disables the bias current generated by the current source.

9. The voltage regulator of claim 7, wherein the current source includes transistors configured as a current mirror to establish bias current in the first and second level translators.

10. The voltage regulator of claim 7, wherein the first and second level translators place the first and second voltages within the common mode range of the differential comparator circuit.

11. The voltage regulator of claim 7, wherein the first level translator establishes the first voltage relative to the input voltage using at least one diode and the second level translator establishes the second voltage relative to the reference voltage using at least one diode.

12. The voltage regulator of claim 11, wherein at least one diode of the first level translator and at least one diode of the second level translator are matched to provide substantially the same voltage offset to both the input voltage and the reference voltage.

13. The voltage regulator of claim 12, wherein the first level translator includes at least one diode more than the second level translator to offset the input voltage so as to establish a difference between the first and second voltages.

14. The voltage regulator of claim 7, wherein the differential comparator circuit includes a first differential comparator stage and a second differential comparator stage, and wherein the second differential comparator stage includes transistors configured as a metastable comparator stage with transistors that are proportioned so as to generate hysteresis.

15. A memory device, comprising:
   an array of storage cells for storing data for the memory device;
   a row decoder and a column decoder that are coupled to the array to select cells of the array to be accessed;
   a voltage pump coupled to the array that provides a regulated output voltage signal; and
   a voltage regulator coupled to the voltage pump and providing an output voltage signal that regulates the voltage pump circuit to maintain a selected voltage level, the voltage regulator comprising:
      a current source that generates a bias current;
      a first level translator, coupled to and responsive to the bias current, that establishes a first voltage, relative to the input voltage;
      a second level translator, coupled to and responsive to the bias current, that establishes a second voltage, relative to a reference voltage; and
      a differential comparator circuit, coupled to receive the first and second voltages from the first and second level translators, that generates a control signal to control the level of the input voltage.

16. The memory device of claim 15, wherein the current source is coupled to an input voltage signal which directly enables or disables the bias current generated by the current source.

17. The memory device of claim 15, wherein the current source includes transistors configured as a current mirror to establish bias current in the first and second level translators.

18. The memory device of claim 15, wherein the first and second level translators place the first and second voltages within the common mode range of the differential comparator circuit.

19. The memory device of claim 15, wherein the first level translator establishes the first voltage relative to the input voltage using at least one diode and the second level translator establishes the second voltage relative to the reference voltage using at least one diode.

20. The memory device of claim 19, wherein at least one diode of the first level translator and at least one diode of the second level translator are matched to provide substantially the same voltage offset to both the input voltage and the reference voltage.

21. The memory device of claim 20, wherein the first level translator includes at least one diode more than the second level translator to offset the input voltage so as to establish a difference between the first and second voltages.

22. The memory device of claim 15, wherein the differential comparator circuit includes a first differential comparator stage and a second differential comparator stage, and wherein the second differential comparator stage includes transistors configured as a metastable comparator stage with transistors that are proportioned so as to generate hysteresis.

23. A process for regulating a voltage, the process comprising:

generating a bias current with a current source;

establishing a differential voltage relative to the input voltage and a reference current using the bias current;

amplifying the differential voltage; and providing a control signal based on the amplified differential voltage to control the level of the input voltage.

* * * * *